(12) United States Patent  (10) Patent No.: US 7,394,152 B2
Yu et al.  (45) Date of Patent: Jul. 1, 2008

(54) WAFER LEVEL CHIP SIZE PACKAGED CHIP DEVICE WITH AN N-SHAPE JUNCTION INSIDE AND METHOD OF FABRICATING THE SAME

(75) Inventors: Guoqing Yu, SuZhou Industrial Park (CN); Youjun Wang, SuZhou Industrial Park (CN); Qinqin Xu, SuZhou Industrial Park (CN); Qingwei Wang, SuZhou Industrial Park (CN); Wei Wang, SuZhou Industrial Park (CN)

(73) Assignee: China Wafer Level CSP Ltd., SuZhou Industrial Park (CN)

( * ) Notice: Subject to any disclaimer, the term of this patent is extended or adjusted under 35 U.S.C. 154(b) by 87 days.

(21) Appl. No.: 11/559,129

(22) Filed: Nov. 13, 2006

(65) Prior Publication Data

US 2008/0111228 A1 May 15, 2008

(51) Int. Cl.
*H01L 31/05* (2006.01)
(52) U.S. Cl. .......... 257/690; 257/E23.06; 257/E23.061; 257/E23.07; 257/E23.66; 257/E21.506; 257/692; 438/597
(58) Field of Classification Search ................ 257/690, 257/692, E23.06, E23.061, E23.07, E33.066, 257/E21.506; 438/597
See application file for complete search history.

(56) References Cited

U.S. PATENT DOCUMENTS

| | | | | |
|---|---|---|---|---|
| 6,326,689 B1 * | 12/2001 | Thomas | ...................... | 257/734 |
| 6,429,036 B1 * | 8/2002 | Nixon et al. | .................. | 438/57 |
| 6,646,289 B1 | 11/2003 | Badehi | ........................ | 257/81 |
| 6,777,767 B2 | 8/2004 | Badehi | ........................ | 257/432 |
| 6,972,480 B2 | 12/2005 | Zilber et al. | ................ | 257/678 |
| 2002/0016024 A1 * | 2/2002 | Thomas | ...................... | 438/113 |

* cited by examiner

*Primary Examiner*—Eugene Lee
*Assistant Examiner*—Peniel M Gumedzoe
(74) *Attorney, Agent, or Firm*—Allen, Dyer, Doppelt, Milbrath & Gilchrist, P.A.

(57) ABSTRACT

The present invention provide a wafer level chip size packaged chip device with a N-shape junction at which external leads electrically connect to peripheral arrayed compatible pads and a method of fabricating the same. In the wafer level chip size package, with such an n-shape junction instead of a conventional T-shape junction observed in Shellcase type wafer level chip size package technology, electrical connections between compatible pads and external leads are more reliable due to larger connection area than the counterpart in the T-shape junction.

5 Claims, 5 Drawing Sheets form and then the individual chip size packages are singulated from the wafer. The latter is referred to as a wafer level chip size package (hereinafter WLCSP). For WLCSP, generally a plurality of compatible pads formed in a peripheral arrayed type on semiconductor chips are redistributed through conventional redistribution processes involving a redistribution layer into a plurality of metal pads, sometimes called solder bumps, in an area array type. The solder bumps on a WLCSP surface are much larger in diameter and much farer inbetween, and the printed circuit board assembly of a WLCSP is more robust. This kind of WLCSP technique has superior electrical performance and lower manufacturing costs than other packaging types, so it will play an important role in the production of future electronics.

WAFER LEVEL CHIP SIZE PACKAGED CHIP DEVICE WITH AN N-SHAPE JUNCTION INSIDE AND METHOD OF FABRICATING THE SAME

FIELD OF THE INVENTION

The present invention relates generally to a wafer level chip size packaging technology, and more particularly to a wafer level chip size packaged chip device that a patterned redistribution metal connects to compatible pads peripherally distributed on silicon chips in the form of n-shape junctions instead of original T-shape junctions for improving the reliability of electrical connection and the method of fabricating such an n-shape junction.

BACKGROUND OF THE INVENTION

With the miniaturization of electronic devices and increasing circuit density in semiconductor industry, chip size package (CSP) is developed, where the package size is similar to the semiconductor chip encased within the package. Conventional packaging technologies, wire bonding, tape automatic bonding (TAB) and flip chip, have their own disadvantages. In wire bonding and TAB, a semiconductor package has a footprint much larger than that of the primitive chip. Flip chip package involves a direct electrical connection of face down electronic components onto substrates/carriers via conductive solder balls/bumps of the chip. The flip-chip package encounters a problem, namely, cracking of solder ball joint due to large thermal expansion mismatch between a wafer and a substrate. Chip size package is manufactured either in the form of individual chips diced from a wafer, or in a wafer Shellcase Co. Israel developed its unique and advanced WLCSP technology, classified ShellOP, ShellOC, and ShellUT, to package optical and image sensors, e.g., charge-coupled devices (CCD) and/or CMOS imagers integrated on a silicon wafer. Currently, CCD and CMOS imagers are explosively used in electronic products. Unlike many packaging methods, the Shellcase process requires no lead frames, or wire bonding. Briefly, ShellOP utilizes a glass/silicon/glass sandwich structure to enable image-sensing capabilities through the actual packaging structure and to protect the sensors from being contaminated by external environment. ShellOC adopts the same sandwich structure, but extra cavities are configured on a first glass which is bonded to a silicon wafer with integrated circuits on for accommodating the above imagers. Also, cavities enable the use of micro-lenses for enhanced image quality. ShellOC is thus the packaging solution of choice for image sensors with micro-lenses. In the ShellUT package, cavities are still kept but a second glass is removed so that the associated package height is reduced. It is expected that ShellUT package should be a mainstream technology among Shellcase type packaging technology in the future. U.S. Pat. Nos. 6,646,289, 6,777,767 and 6,972,480 are considered to be relevant.

FIG. 1 is a typical cross-section of prior art ShellOC packaged chip device with a one-layer lead structure and T-shape junction thereof. As shown in FIG. 1, a first/top glass 5 with cavity walls 10 thereon covers compatible pads 15 furnished silicon chip 20. An epoxy 25 is used to bond a second/bottom glass 30 to the chip 20 on which a portion of compatible pads have been exposed before by means of photolithography and plasma etching techniques. After a barrier solder mask 35 is coated on the glass 30, notching is performed so that inverted leads 40, via sputtering deposition, connect electrically to the compatible pads 15 in the form of so-called T-shape junction as marked by circle. The leads 40 are coated with a protective solder mask 45 thereon. The solder-mask 45 is a dielectric material that electrically isolates the leads 40 from external contact, and protects the lead surface against corrosion. Solder bumps 50 are attached to the bottom end of leads 45, and are suitable for printed circuit board (PCB) mounting by known methods. Solder bumps 50 may be formed by known methods such as screen printing, and may be suitably shaped for PCB mounted.

In the foregoing Shellcase type WLCSP technology, a T-shape junction is formed between the compatible pad and the lead. The T-shape junction is believed to be rather fragile, e.g., upon undergoing stress-induced deformation during or after packaging, in terms of electrical connection.

SUMMARY OF THE INVENTION

The present invention is intended to provide a WLCSP structure having a better electrical connection between external leads and peripheral arrayed compatible pads and the method for fabricating the same.

In accordance with one embodiment of the present invention, a wafer level chip size packaged chip device with a N-shape junction comprises:

a substrate having formed thereon a silicon chip, with a plurality of compatible pads disposed at the periphery of said chip on said substrate;

packaging structure for receiving and packaging said chip and said substrate;

a plurality of solder bumps each attached to a bottom surface of said packaging structure; and metal leads to enable electrical connection between said compatible pads and said solder bumps;

wherein, in addition to the lateral side, a portion of both top and bottom sides of each said compatible pad is exposed so as to form a N-shape junction between said compatible pad and said lead.

The present invention further provides a method for fabricating the wafer level chip size packaged chip device with a N-shape junction, comprising following steps:

providing a wafer, which has plurality of substrates having formed thereon a silicon chip, with plurality of compatible pads disposed at the periphery of said chip on said substrate;

disposing packaging structure for receiving and packaging said chip and said substrate;

disposing a plurality of solder bumps each attached to a bottom surface of said packaging structure; and disposing metal leads to enable electrical connection between said compatible pads and said solder bumps;

wherein, in addition to the lateral side, a portion of both top and bottom sides of each said compatible pad is exposed so as to form a N-shape junction between said compatible pad and said lead;

cutting said wafer so as to form individual chip size packaged chip device.

Wherein before the step of disposing metal leads, etching the packaging structure, so as to expose the lateral side, a portion of both top and bottom sides of each said compatible pad.

Wherein said etching is performed by plasma processing.

In the wafer level chip size packaged chip device of the present invention, with such an n-shape junction instead of a conventional T-shape junction, electrical connections between compatible pads and external leads are more reliable due to larger connection area than the counterpart in the T-shape junction.

DETAILED DESCRIPTION

Figure 1:
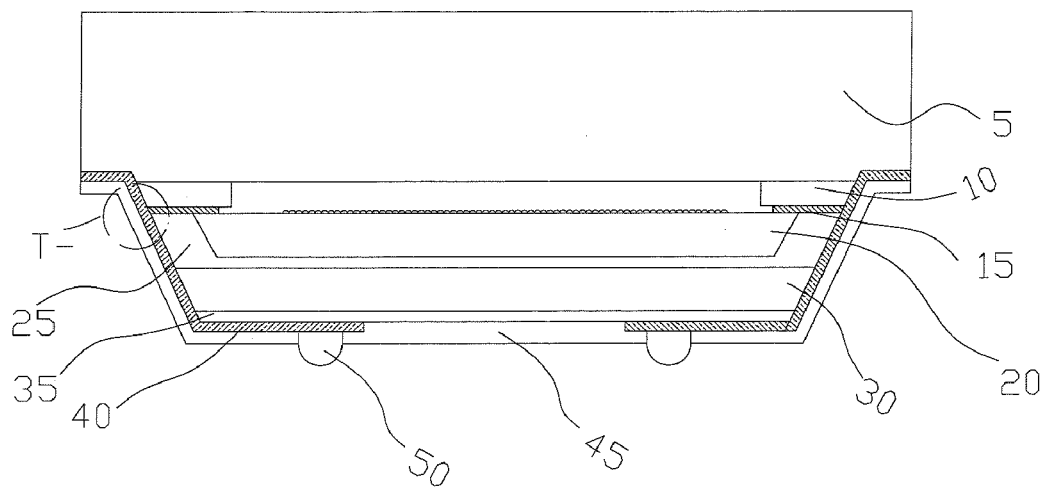
FIG. 1 is a typical cross-section of prior art ShellOC packaged chip device with a T-shape junction inside.

Wherever possible, the same reference numbers are used in the drawings and the description to refer to the same or like parts.

We follow a whole package process flow, although some process steps of which are exactly the same as that of the standard Shellcase packaging technology, to present the current invention. In this way, it will help one to understand the present invention well.

Figure 2A:
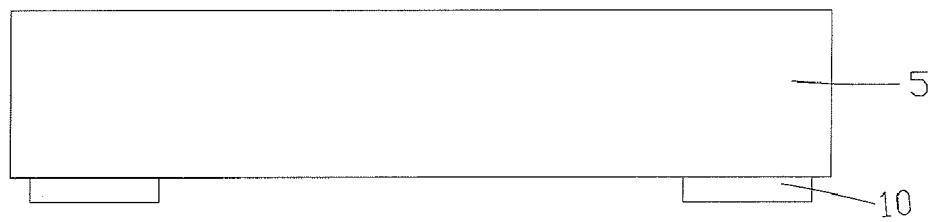
FIGS. 2A to 2J show the schematic package process flow for fabricating the ShellOC packaged chip device with a N-shape junction according to one embodiment of the present invention.
Figure 2B:
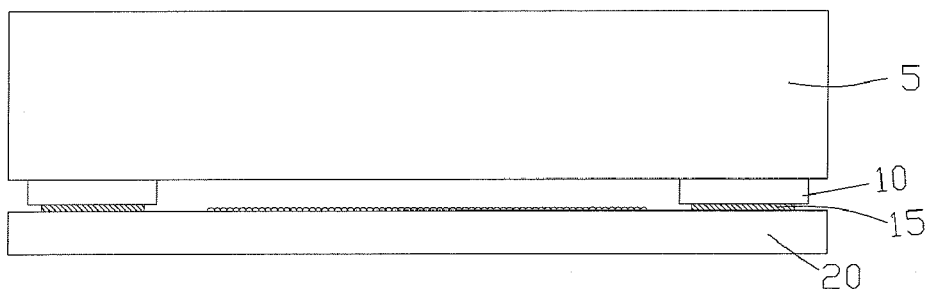
Figure 2C:
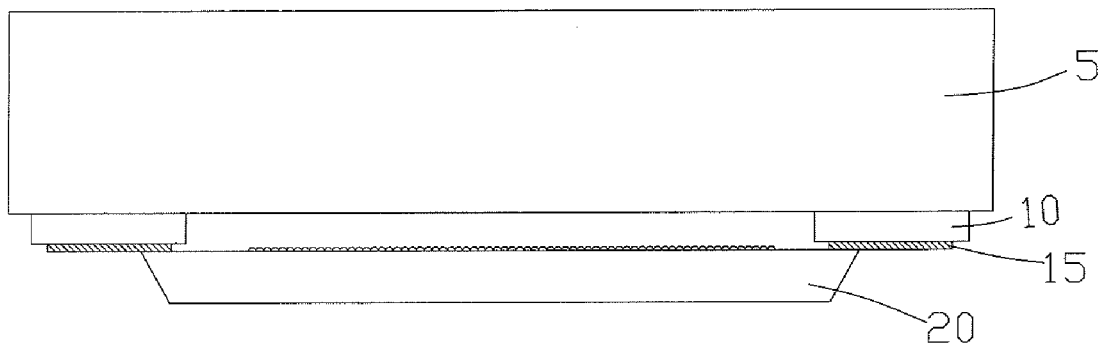
Figure 2D:
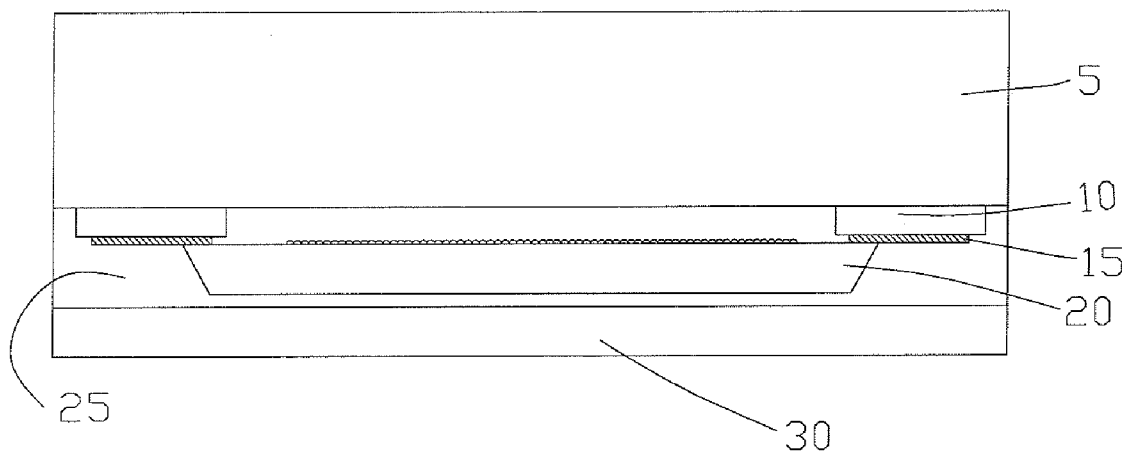
Figure 2E:
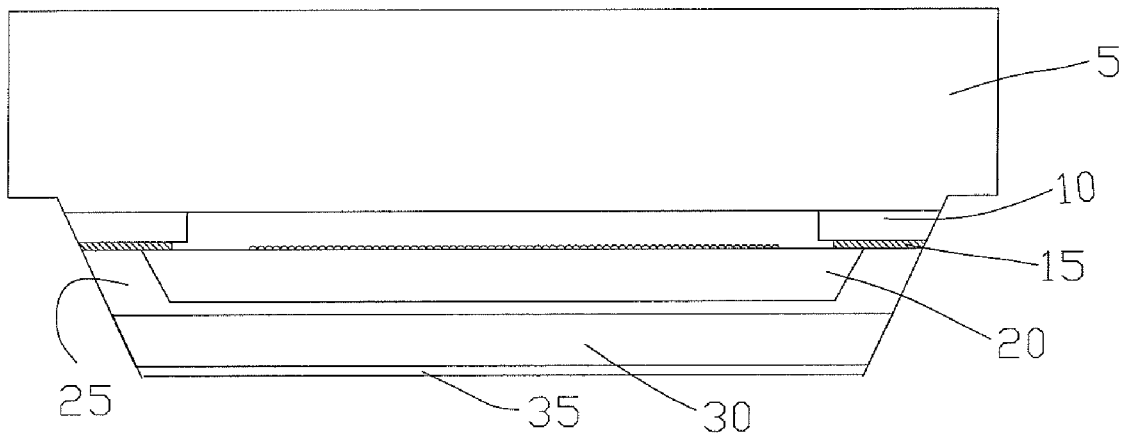
Figure 2F:
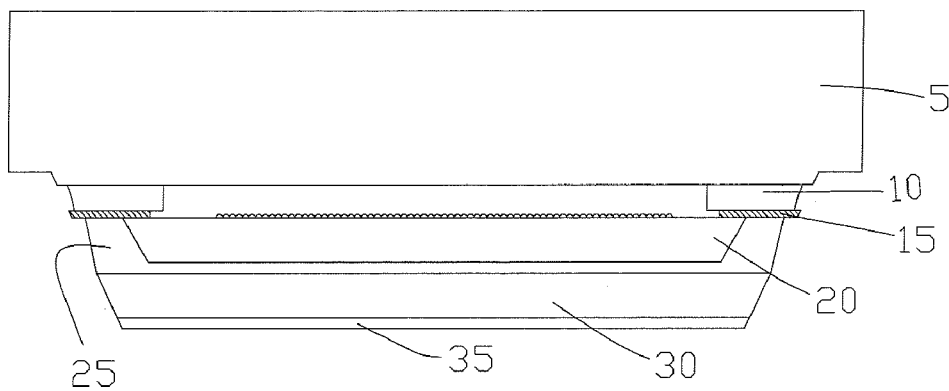
Figure 2G:
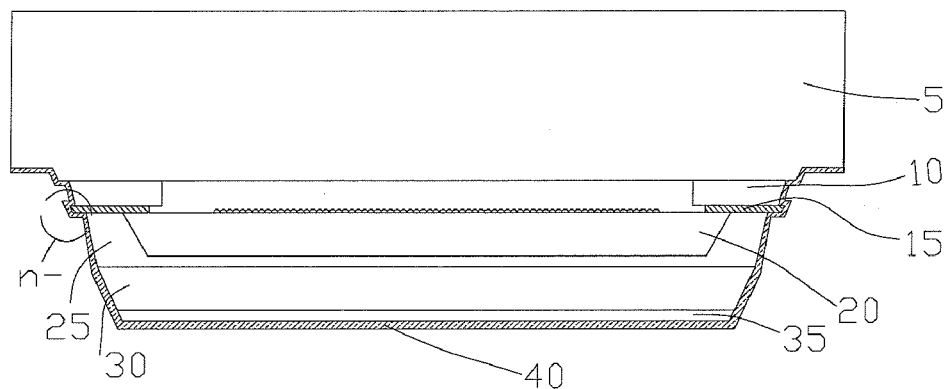
Figure 2H:
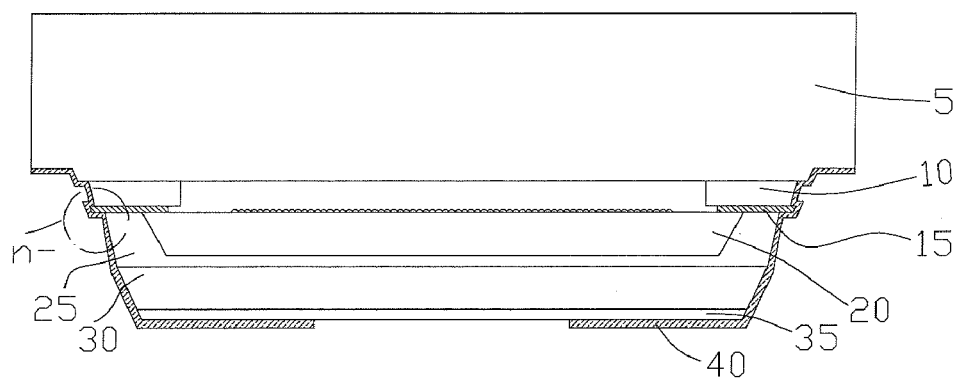
Figure 2I:
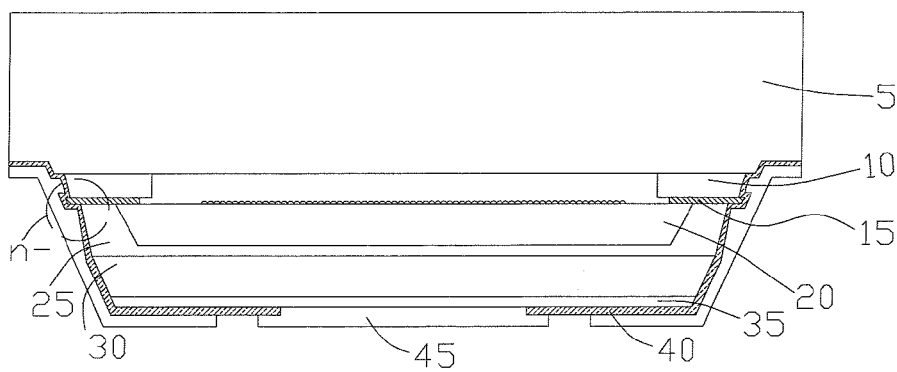
Figure 2J:
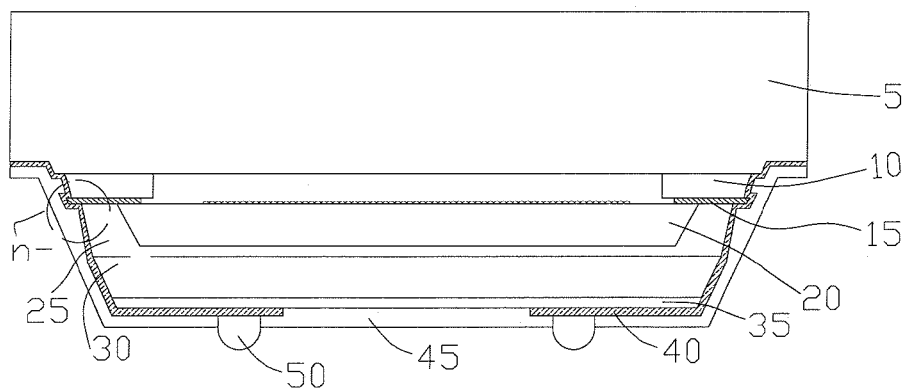

For one preferred embodiment of this invention based on ShellOC technology, references are made to FIG. 2A-FIG. 2J. As shown, on a first glass 5, cavity walls 10 are formed by photolithography technique (FIG. 2A). The glass 5 with cavity walls 10 formed thereon is applied to cover the silicon chip 20 with optical or image sensors thereof and peripheral arrayed compatible pads 15 thereon (FIG. 2B), wherein an optical/image component (as shadowed) is encased within a cavity, thereby preventing the optical/image component from being contaminated by outside environment. Following this, the chip 20 is selectively etched from its backside by means of photolithography and plasma techniques, thus a portion of compatible pads 15 (FIG. 2C) being exposed through trench formation therein. An insulating material 25 is employed to fully fill the trench and therefore covers the silicon slope and compatible pads 15 exposed already thereof. Afterwards, a second glass 30 is bonded with an epoxy to the silicon chip 20 (FIG. 2D). By now, a glass/silicon/glass sandwich structure has been produced in the terms of ShellOC package technology. An insulating material 35, as a mechanical buffer layer, is coated on the glass 30 followed by nothing (FIG. 2E), thereby the lateral side of compatible pads being exposed for later electrical connection through metal deposition. To improve the reliability of electrical connection, one way is to expand effective connection area. To this end, plasma processing with an appropriate gas, e.g., oxygen is performed, via chemical reaction, to remove organic compounds which surround compatible pads 15 somewhere. Due to that the plasma processing is of non-line-of-sight, a portion of both top and bottom sides of compatible pads 15 are exposed as in FIG. 2F. Metal deposition proceeds to achieve external leads 40 which electrically connect to compatible pads 15 in the n-shape junction form rather than T-shape junction in the standard Shellcase packaging technology. In other words, leads 40 electrically connect compatible pads 15 not only via the lateral side of compatible pads 15 but also via a part of top and bottom sides of compatible pads 15. It should also be stressed here that plasma pre-etching might be executed right prior to metal deposition for removal of oxide covering compatible pads 15 (FIG. 2G). Following the metal layer deposition, lithography process for defining lead lines and plating process for well-known under ball metallurgy (UBM) are carried out as in the standard Shellcase packaging technology (FIG. 2H). Thereafter, also as in the standard process flow, a photo-imageable solder mask face layer 45 preparation and Lead-free solder bumps 50 printing are performed in sequence (FIG. 2I and FIG. 2J). After the whole packaging process is finished, the packaged chips (FIG. 2J) are singulated from the whole wafer via dicing.

Figure 3:
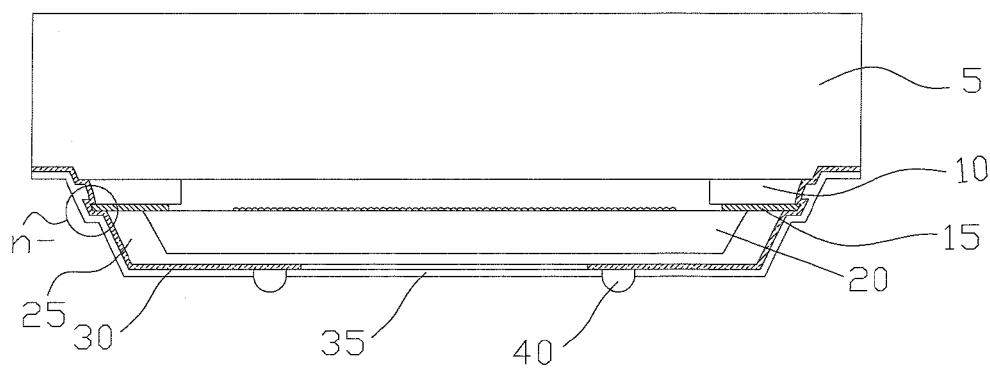
FIG. 3 is a schematic cross-section of the ShellUT packaged chip device with a N-shape junction according to another embodiment of the present invention.
Figure 4:
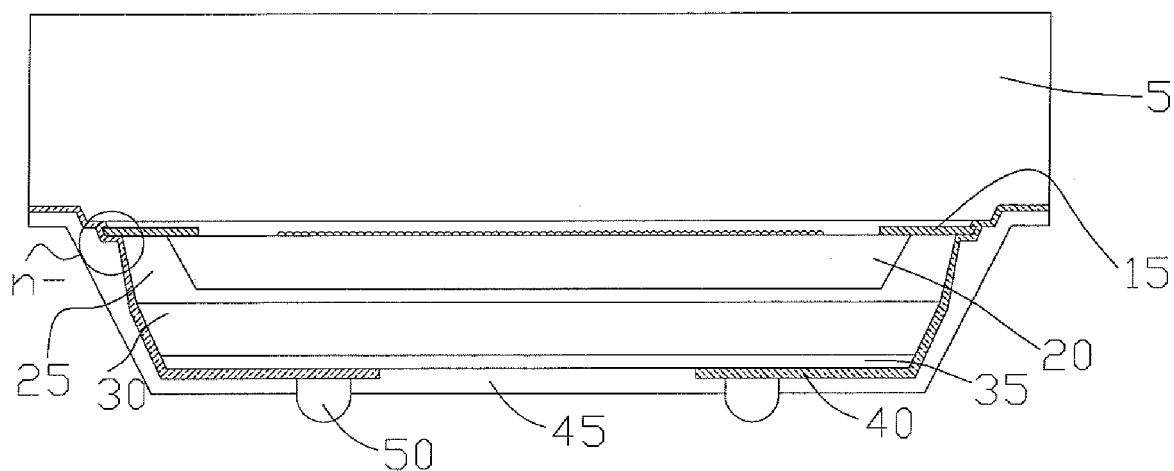
FIG. 4 is a schematic cross-section of the ShellOP packaged chip device with a N-shape junction according to another embodiment of the present invention.

The above embodiment of the invention is described based on ShellOC process flow. It should be pointed out that the current invention is applicable to ShellUT and ShellOP. FIG. 3 shows schematic cross-sectional views of ShellUT packaged chip with n-shape junctions incorporated thereof. FIG. 4 shows schematic cross-sectional views of ShellOP packaged chip with n-shape junctions incorporated thereof. The difference among ShellOC, ShellUT, ShellOP has been described above and can be observed easily. Herein relevant package processes are skipped as they are very similar to each other.

The embodiments shown and described above are preferred and illustrative but not restrictive, and other embodiments not disclosed here may include the same concept, scope and spirit of the invention. Some variations or modifications in other embodiments could be clear to those skilled in the art.

What is claimed is:

1. A wafer level chip size packaged chip device with a N-shape junction comprises:
    a substrate having formed thereon a silicon chip, with a plurality of compatible pads disposed at the periphery of said chip on said substrate;
    packaging structure for receiving and packaging said chip and said substrate;
    a plurality of solder bumps each attached to a bottom surface of said packaging structure; and
    metal leads to enable electrical connection between said compatible pads and said solder bumps;
    wherein, in addition to the lateral side, a portion of both top and bottom sides of each said compatible pad is exposed so as to form a N-shape junction between said compatible pad and said lead.

2. A wafer level chip size packaged chip device with a N-shape junction as claimed in claim 1, wherein, said packaged chip device is one of a ShellOC, ShellUT or ShellOP packaged chip.

3. A method for fabricating the wafer level chip size packaged chip device with a N-shape junction as claimed in claim 1, comprising following steps:
    providing a wafer, which has plurality of substrates having formed thereon a silicon chip, with plurality of compatible pads disposed at the periphery of said chip on said substrate;
    disposing packaging structure for receiving and packaging said chip and said substrate;

disposing a plurality of solder bumps each attached to a bottom surface of said packaging structure; and disposing metal leads to enable electrical connection between said compatible pads and said solder bumps;

wherein, in addition to the lateral side, a portion of both top and bottom sides of each said compatible pad is exposed so as to form a N-shape junction between said compatible pad and said lead;

cutting said wafer so as to form individual chip size packaged chip device.

4. A method for fabricating the wafer level chip size packaged chip device with a N-shape junction as claimed in claim 3, wherein, before the step of disposing metal leads, etching the packaging structure, so as to expose the lateral side, a portion of both top and bottom sides of each said compatible pad.

5. A method for fabricating the wafer level chip size packaged chip device with a N-shape junction as claimed in claim 4, wherein said etching is performed by plasma processing.

* * * * *